(12) United States Patent
Wei et al.

(10) Patent No.: US 11,765,933 B2
(45) Date of Patent: Sep. 19, 2023

(54) SILICON-BASED OLED DISPLAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Junbo Wei, Beijing (CN); Shengji Yang, Beijing (CN); Kuanta Huang, Beijing (CN); Pengcheng Lu, Beijing (CN); Yuanlan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 91 days.

(21) Appl. No.: 17/213,532

(22) Filed: Mar. 26, 2021

(65) Prior Publication Data

US 2022/0093696 A1    Mar. 24, 2022

(30) Foreign Application Priority Data

Sep. 22, 2020   (CN) .......................... 202011000611.8

(51) Int. Cl.
| | |
|---|---|
| *H10K 59/121* | (2023.01) |
| *G09G 3/3225* | (2016.01) |
| *H10K 50/844* | (2023.01) |
| *H10K 59/38* | (2023.01) |
| *H10K 59/126* | (2023.01) |
| *H10K 71/00* | (2023.01) |
| *H10K 77/10* | (2023.01) |
| *H10K 59/12* | (2023.01) |

(52) U.S. Cl.
CPC ......... *H10K 59/121* (2023.02); *G09G 3/3225* (2013.01); *H10K 50/844* (2023.02); *H10K 59/126* (2023.02); *H10K 59/38* (2023.02); *H10K 71/00* (2023.02); *H10K 77/10* (2023.02); *G09G 2320/0233* (2013.01); *H10K 59/1201* (2023.02)

(58) Field of Classification Search
CPC .................................................... H10K 59/121
See application file for complete search history.

(56) References Cited

U.S. PATENT DOCUMENTS

| | | | |
|---|---|---|---|
| 10,921,855 B1* | 2/2021 | Wen ...................... G09G 3/3275 |
| 2010/0060205 A1* | 3/2010 | Vaassen ................. H05B 45/48 |
| | | | 438/23 |
| 2012/0043999 A1* | 2/2012 | Quevy ...................... H03L 7/18 |
| | | | 327/147 |
| 2016/0190228 A1* | 6/2016 | Park .................... H01L 27/3276 |
| | | | 257/40 |

(Continued)

*Primary Examiner* — Caleb E Henry
(74) *Attorney, Agent, or Firm* — Calfee, Halter & Griswold LLP

(57) ABSTRACT

A silicon-based OLED display substrate, a manufacturing method thereof and a display device are provided. The display substrate includes: a silicon-based base and a device layer arranged on the silicon-based base. The silicon-based base includes a drive circuit layer. The drive circuit layer includes a drive circuit, an electrical connection bonding area, and a storage unit storing compensation voltage of each MOSFET of the drive circuit. An orthographic projection of the drive circuit on the silicon-based base, an orthographic projection of the storage unit on the silicon-based base, and an orthographic projection of the electrical connection binding area on the silicon-based base do not overlap with each other.

17 Claims, 4 Drawing Sheets

(56) References Cited

U.S. PATENT DOCUMENTS

| | | | |
|---|---|---|---|
| 2018/0157099 A1* | 6/2018 | Cheng | G02F 1/1343 |
| 2020/0176722 A1* | 6/2020 | Lu | H01L 51/0018 |
| 2020/0211477 A1* | 7/2020 | Lai | G09G 3/3266 |
| 2021/0134191 A1* | 5/2021 | Jung | H01L 25/167 |
| 2021/0158734 A1* | 5/2021 | Kim | H01L 51/0097 |
| 2021/0175462 A1* | 6/2021 | Shin | H01L 51/529 |
| 2021/0305535 A1* | 9/2021 | Zhang | H01L 51/5253 |
| 2022/0006042 A1* | 1/2022 | Tang | H10K 59/38 |
| 2022/0013607 A1* | 1/2022 | Lee | H10K 59/38 |
| 2022/0045288 A1* | 2/2022 | Paek | H10K 50/844 |

\* cited by examiner

SILICON-BASED OLED DISPLAY SUBSTRATE AND MANUFACTURING METHOD THEREOF, AND DISPLAY DEVICE

CROSS-REFERENCE TO RELATED APPLICATIONS

This application claims priority to Chinese Patent Application No. 202011000611.8, filed on Sep. 22, 2020, the disclosure of which is incorporated herein by reference in its entirety.

TECHNICAL FIELD

The present disclosure relates to the field of display technology, in particular to a silicon-based OLED display substrate and a manufacturing method thereof, and a display device.

BACKGROUND

Micro-OLED is a new type of OLED display device that has a silicon substrate as a base. The silicon-based OLED has the characteristics of small size and high resolution, and is manufactured with a mature integrated circuit CMOS process, thereby realizing active addressing of pixels. The silicon-based OLED has various circuits such as TCON and OCP to achieve light weight. It is widely used in the fields of a near-eye display and virtual reality and augmented reality, especially in AR/VR head-mounted display devices.

Silicon-based OLED display devices are currently used in AR/VR devices where ultra-high pixels per inch (PPI) is required to prevent graininess after imaging and zooming in. To achieve ultra-high PPI, the size of pixels is required to be small enough, for example, the size of pixels is less than 5 µm. Since the size of pixels is small enough, during the manufacturing process of the silicon-based OLED display device, driving MOSFETs (metal oxide semiconductor field-effect transistors) of the micron-level pixels, matched with the display device, in the silicon-based OLED display device are expected to have a very small size and the number of the driving MOSFETs is large, and there are certain differences in the manufacturing process for the large number of driving MOSFETs. The difference of the MOSFETs used to drive the pixels will directly lead to the difference of the display brightness of the OLED display device, and thus affecting the display effect.

SUMMARY

A first embodiment of the present disclosure provides a silicon-based OLED display substrate, including: a silicon-based base and a device layer arranged on the silicon-based base. The silicon-based base includes a drive circuit layer. The drive circuit layer includes a drive circuit, an electrical connection bonding area, and a storage unit for storing compensation voltage of each MOSFET of the drive circuit. An orthographic projection of the drive circuit on the silicon-based base, an orthographic projection of the storage unit on the silicon-based base, and an orthographic projection of the electrical connection binding area on the silicon-based base do not overlap with each other.

In some embodiments, the storage unit is located on a side of the electrical connection bonding area close to the driving circuit.

In some embodiments, an orthographic projection of the driving circuit layer on the silicon-based base is a rectangle, including a long edge and a short edge; the electrical connection bonding area is located on a side of the driving circuit layer corresponding to the short edge, and a distance between the storage unit and the long edge is greater than a preset cutting threshold; or the electrical connection bonding area is located on a side of the driving circuit layer corresponding to the long edge, and the distance between the storage unit and the short edge is greater than the preset cutting threshold.

In some embodiments, the device layer includes an anode, an organic light-emitting layer, a cathode, a first encapsulation layer, and a color filter layer that are stacked in sequence in a direction facing away from the silicon-based base.

In optional embodiments, the device layer further includes a second encapsulation layer located on a side of the color filter layer facing away from the first encapsulation layer.

In some embodiments, the display substrate further includes a shielding layer disposed on a side of the storage unit close to the device layer, and an orthographic projection of the shielding layer on the silicon-based base covers the orthographic projection of the storage unit on the silicon-based base.

A second aspect of the present disclosure provides a silicon-based OLED display device, including the display substrate described in the first aspect of the present disclosure.

A third aspect of the present disclosure provides a method for manufacturing the display substrate of the first aspect of the present disclosure, including: forming a driving circuit layer on a silicon-based base, where the driving circuit layer includes a driving circuit, an electrical connection bonding area, and a storage unit for storing compensation voltage of each MOSFET of the driving circuit, an orthographic projection of the driving circuit on the silicon-based base, an orthographic projection of the storage unit on the silicon-based base, and an orthographic projection of the electrical connection bonding area on the silicon-based base do not overlap with each other; and forming a device layer on the driving circuit.

In some embodiments, forming the driver circuit layer on the silicon-based base further includes: forming the driver circuit on the silicon-based base; forming the storage unit on the silicon-based base; forming the electrical connection binding area electrically connected to output signal lines of the driving circuit.

In some optional embodiments, after forming the storage unit on the silicon-based base, the method further includes: forming a shielding layer on the storage unit, where an orthographic projection of the shielding layer on the silicon-based base covers the orthographic projection of the storage unit on the silicon-based base.

BRIEF DESCRIPTION OF THE DRAWINGS

In order to clearly explain technical solutions of embodiments of the present disclosure, drawings mentioned in the description of the embodiments are briefly introduced below. Apparently, the drawings in the following description are only some embodiments of the present disclosure. For those of ordinary skill in the art, other drawings can be obtained based on these drawings without paying creative work.

DETAILED DESCRIPTION

Figure 1:
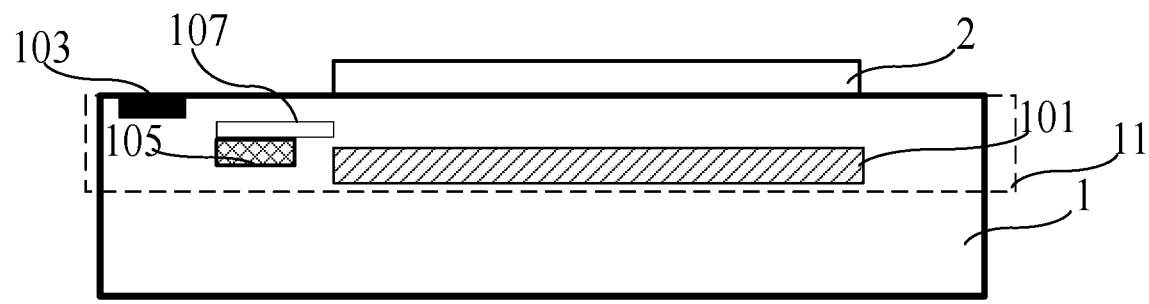
FIG. 1 is a cross-sectional view showing a structure of a display substrate according to an embodiment of the present disclosure.

In order to explain the present disclosure more clearly, the present disclosure will be further described below in combination with preferred embodiments and accompanying drawings. The same reference numerals in the drawings denote similar parts. Those skilled in the art should understand that the content described below is illustrative rather than restrictive, and should not be used to limit the protection scope of the present disclosure.

It should be noted that terms "on", "formed on . . . " and "disposed on . . . " as used in herein can mean that a layer is directly formed or disposed on another layer, or it can mean that a layer is indirectly formed or disposed on another layer, that is, there are other layers between the two layers. Unless otherwise specified, the term "located on the same layer" as used herein means that two layers, parts, components, elements or parts can be formed by the same patterning process, and the two layers, parts, components, elements or parts are generally formed of the same material. Unless otherwise specified, the terms "patterning process" as used herein generally includes steps of photoresist coating, exposure, development, etching, and photoresist stripping. The expression "one patterning process" means a process of forming patterned layers, parts, components, etc., using one mask.

As shown in FIG. 1, an embodiment of the present disclosure provides a silicon-based OLED display substrate. The display substrate includes a silicon-based base and a device layer arranged on the silicon-based base. The silicon-based base includes a drive circuit layer. The drive circuit layer includes a drive circuit, an electrical connection bonding area, and a storage unit for storing compensation voltage of each MOSFET of the drive circuit. An orthographic projection of the drive circuit on the silicon-based base, an orthographic projection of the storage unit on the silicon-based base, and an orthographic projection of the electrical connection binding area on the silicon-based base do not overlap with each other.

In the embodiment, the silicon-based OLED display substrate is provided with the storage unit used for storing the compensation voltage of each MOSFET of the driving circuit, so that the voltage compensation of each MOSFET is realized. As a result, the uniformity of the driving characteristics of each MOSFET in the driving circuit is achieved, and the uniformity of the display brightness is also achieved, thereby improving the display effect of the silicon-based OLED display substrate.

In a specific embodiment, as shown in FIG. 1, the display substrate includes a silicon-based base 1, and a device layer 2 is formed on the silicon-based base 1. The silicon-based base 1 is provided with a driving circuit layer 11. The driving circuit layer 11 includes a driving circuit 101 for driving the device layer, an electrical connection bonding area 103 for electrical connection with an external circuit (for example, a flexible printed circuit (FPC) board), and a storage unit 105 for storing compensation voltage of each MOSFET of the driving circuit. The driving circuit 101, the electrical connection bonding area 103 and the storage unit 105 are independently formed in the silicon-based base 1, that is, the orthographic projection of the drive circuit 101 on the silicon-based base 1, the orthographic projection of the storage unit 105 on the silicon-based base 1, and the orthographic projection of the electrical connection bonding area 103 on the silicon-based base 1 do not overlap with each other. Those skilled in the art can understand that although the electrical connection bonding area 103 is formed inside the silicon-based base 1 as shown in the figures, such as in a manner of a recess, the electrical connection bonding area 103 can also be formed in the form of a pad higher than the surface of the silicon-based base 1. The specific form of the electrical connection bonding area 103 depends on the form of the external circuit to be electrically connected.

In the application, the storage unit 105 is one time programmable (OTP) memory, which is a memory type of MCU and belongs to physical fused storage. The program cannot be changed after being written into the IC. Moreover, the storage unit is configured as OTP with an expandable row, for example, multiple OTP components are cascaded to obtain a larger storage space, and the OTP is cost-effective, which can effectively reduce the manufacturer's manufacturing cost.

In the application, the OTP component is provided in the drive circuit layer to store the compensation voltage of each MOSFET of the drive circuit. For example, the compensation voltage may be correction data of each MOSFET, such as the offset of the voltage. The compensation voltages are designed in the OTP in a form of trimming code, and the compensation voltages and various MOSFET in the drive circuit are in a one-to-one correspondence. In this way, it is ensured that compensation and correction are performed on each MOSFET in the drive circuit used to drive the device layer. Therefore, even in silicon-based OLED with a large number of pixels, even in silicon-based Micro-OLED with a huge number of pixels, the uniformity of the brightness of the display substrate can still be achieved, and the display effect of the OLED display substrate can be improved.

Specifically, the storage unit 105 is located on a side of the electrical connection bonding area 103 close to the driving circuit 101. That is, in the embodiment of the present disclosure, the storage unit 105 is arranged between the electrical connection bonding area 103 and the driving circuit 101 rather than being arranged on a side of the driving circuit 101 without the electrical connection bonding area 103. In this way, the wafer can be cut to form the display substrate without considering the existence of the storage unit 105, so that the position where the cutting is performed is closer to the driving circuit 101, which is conducive to the miniaturization design of the display substrate.

Figure 2:
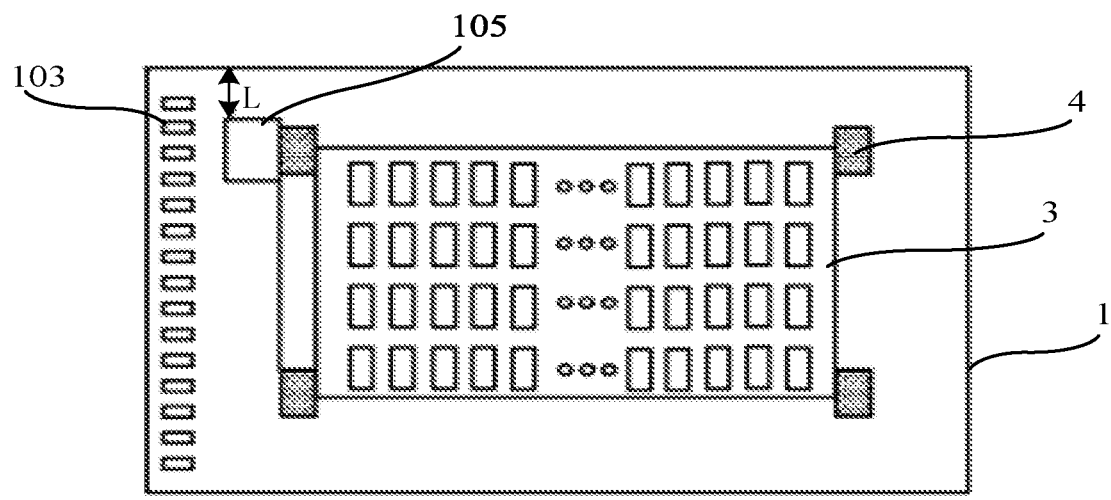
FIG. 2 is a top view of a display substrate according to an embodiment of the present disclosure.
Figure 3:
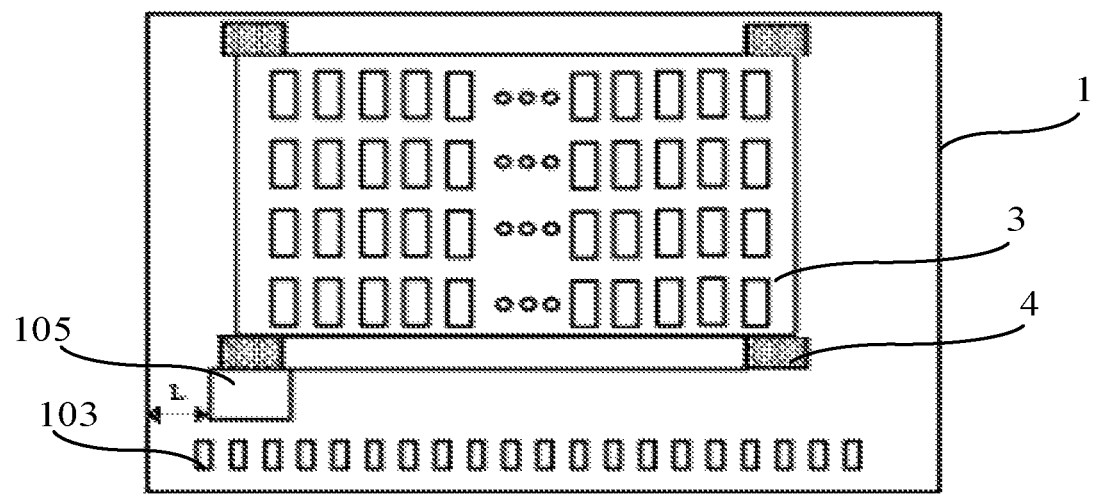
FIG. 3 is a top view of a display substrate according to an embodiment of the present disclosure.

FIG. 2 is a top view of a display substrate according to an embodiment of the present disclosure, and FIG. 3 is a top view of a display substrate according to another embodiment of the present disclosure. For ease of illustration, a shielding layer 107 described later is omitted in FIG. 2 and FIG. 3.

Specifically, referring to FIGS. 2 and 3, the orthographic projection of the driving circuit layer 11 on the silicon-based base 1 is a rectangle including long an edge and a short edge. When the electrical connection bonding area 103 is located on a side of the driving circuit layer 11 corresponding to the short edge, the distance between the storage unit 105 and the long edge is greater than a preset cutting threshold L. Alternatively, when the electrical connection bonding area 103 is located on a side of the driving circuit layer 11 corresponding to the long edge, the distance between the storage unit 105 and the short edge is greater than the preset cutting threshold L. When independent dies are formed by cutting a large wafer, a certain cutting accuracy is required. For example, the cutting accuracy of the related art is usually 150 microns. Optionally, in this application, the cutting threshold is set based on the existing cutting accuracy, and can be set as 450 microns. Those skilled in the art should understand that the present disclosure is not limited to this, the cutting threshold can also be appropriately reduced as the cutting accuracy improves.

In this way, in the above situations, the distance between the storage unit 105 and the long edge or the short edge is set to be greater than the preset cutting threshold, so as to ensure that the storage unit cannot be cut. Further, during a procedure of manufacturing a single die as the display substrate and further manufacturing as a display module needs, the die needs to undergo a plurality of processes, such as die bonding, FPC bonding (when the external circuit is FPC, when the external circuit is other circuits, it can also be bonding with other circuits), cover glass lamination and the like. In the procedure, silicon wafer broken may be happened on the edge of the die. In this case, the storage unit 105 is easy to be damaged, resulting in the loss of the trimming code. By setting the distance between the storage unit 105 and the long edge/the short edge to be greater than the preset cutting threshold in the above situations, it is possible to effectively prevent the damage to the structure of the storage unit 105 caused by the silicon wafer broken in the subsequent production process. As a result, the uniformity of brightness of the display substrate is further ensured, and the display effect of the OLED display substrate is improved.

Figure 4:
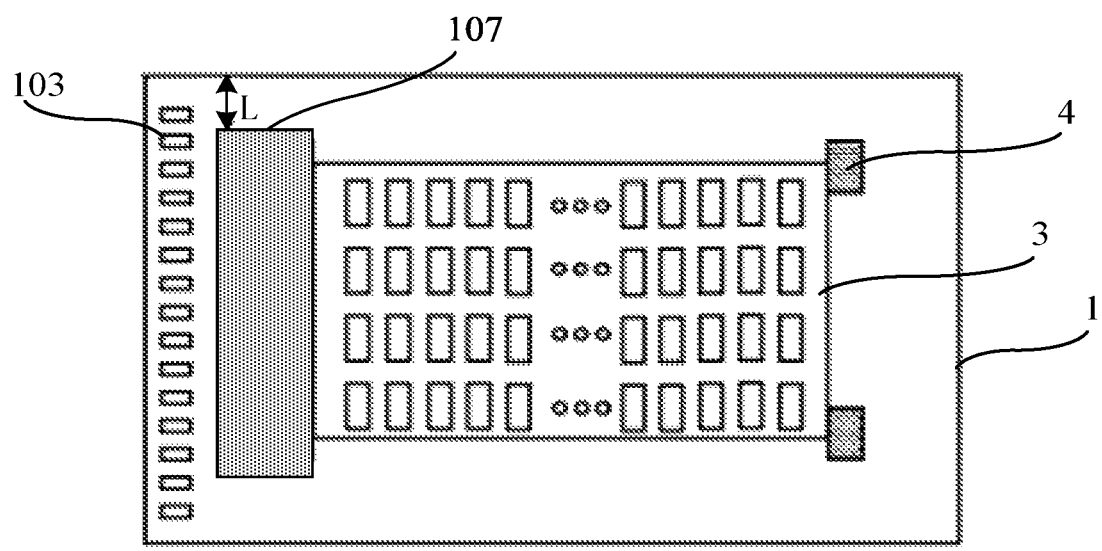
FIG. 4 is a top view of a display substrate according to an embodiment of the present disclosure.

In some optional embodiments, the display substrate further includes a shielding layer 107 arranged on a side of the storage unit 105 close to the device layer. The orthographic projection of the shielding layer 107 on the silicon-based base 1 covers the orthographic projection of the storage unit 105 on the silicon-based base 1, so as to protect the storage unit 105. Specifically, FIG. 4 shows that the orthographic projection of the shielding layer 107 on the silicon-based base 1 is larger than the orthographic projection of the storage unit 105 on the silicon-based base 1, but the present application is not limited to this. The orthographic projection of the shielding layer 107 on the silicon-based base 1 may correspond to the orthographic projection of the storage unit 105 on the silicon-based base 1 as long as the storage unit 105 can be protected. The shielding layer 107 may be a metal layer structure, and the shielding layer may be provided in a rectangular, hexagonal or polygonal shape.

Figure 5:
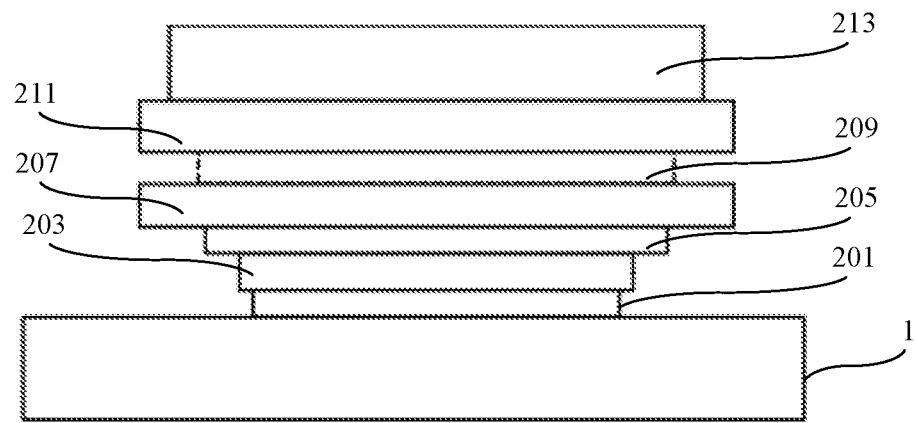
FIG. 5 is a cross-sectional view showing a structure of a device layer in the display substrate of an embodiment of the present disclosure.

In some embodiments, with reference to FIG. 5, the device layer 2 includes an anode 201, an organic light-emitting layer 203, a cathode 205, a first encapsulation layer 207, and a color filter layer 209 that are stacked in sequence in a direction facing away from the silicon-based base 1.

Specifically, the device layer is manufactured in a stacked manner. Referring to FIG. 5, the anode 201 is fabricated above the driving circuit in the silicon-based base 1, and is served as the first electrode of the organic light-emitting layer 203. The organic light-emitting layer 203 is usually a structural layer made of organic materials and is capable of emitting white light. Through the luminescent properties of the organic materials, holes and electrons are excited under the action of voltage or current to form excitons, thereby emitting light. The cathode 205 made from metal is provided on the organic light-emitting layer 203. The cathode 205 has a transparent structure. The first encapsulation layer 207 is provided on a side of the cathode 205 facing away from the organic light-emitting layer 203. The cathode 205 can be made from materials selected from one or more of Mg, Ag or alloy materials. The first encapsulation layer 207 may be a thin-film encapsulation layer to protect the light-emitting part composed of the anode 201, the organic light-emitting layer 203, and the cathode 205.

Figure 6:
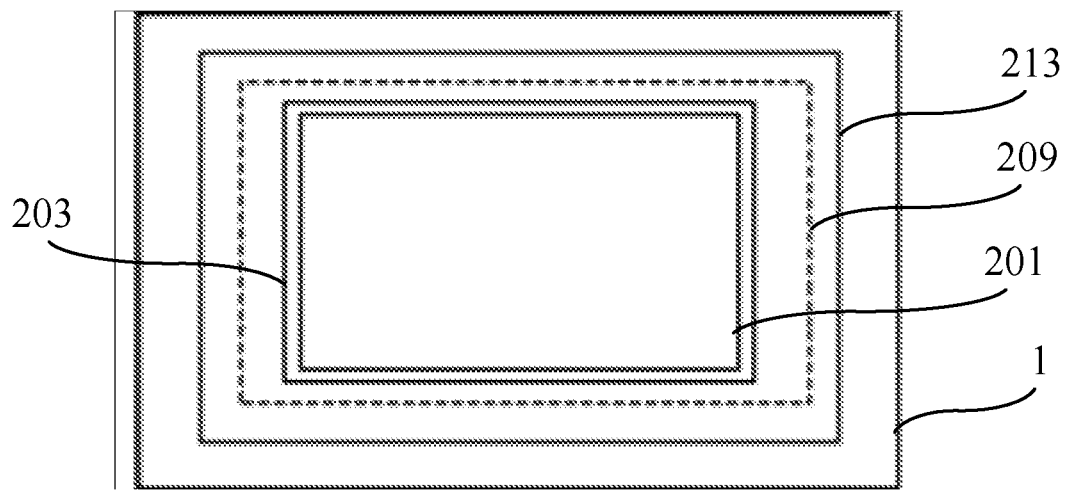
FIG. 6 is a top view showing the device layer in the display substrate of an embodiment of the present disclosure.

The color filter layer 209 is provided on the first encapsulation layer 207, and may be an RGB color filter layer. As shown in FIG. 5 and FIG. 6, the orthographic projection of the color filter layer 209 in the direction perpendicular to the silicon-based base 1 covers the orthographic projection of the organic light-emitting layer 203, so as to realize a color light. The color filter layer 209 does not emit light by itself, and includes a black matrix, a red (R) color filter, a green (G) color filter and a blue (B) color filter. The color filter layer 209 cooperates with the organic light emitting layer 203. Specifically, the color filter layer 209 cooperates with the white light emitted by the organic light-emitting layer 203 under the action of the anode 201 and the cathode 205 to achieve a high PPI so as to meet the requirement of a PPI greater than 2000 in application scenarios such as microdisplays.

Moreover, the device layer 2 further includes a second encapsulation layer 211 disposed on the side of the color filter layer 209 facing away from the first encapsulation layer 207, and the second encapsulation layer 211 may also be a thin-film encapsulation layer. The second encapsulation layer 211 is used in combination with the first encapsulation layer 207 to realize effective encapsulation of the device, thereby realizing a limited barrier to water vapor and oxygen, and achieving the function of protecting the device and prolonging the lifespan. To protect the structures in the device layer and achieve a good sealing effect, the second encapsulation layer 211 is made from an organic material with good sealing properties, an inorganic material with good sealing properties or one or more combinations thereof. Preferably, the material may be selected from silicon dioxide, silicon nitride and the like.

A second aspect of the present disclosure provides a silicon-based OLED display device including the display substrate described in the embodiments in the first aspect of the present disclosure. The specific implementation of this embodiment is the same as the above embodiments, and will not be repeated here.

Moreover, referring to FIGS. 5 and 6, the display device further includes a cover glass 213 disposed on the second encapsulation layer 211. The cover glass 213 is a transparent glass, and may be mother glass with high transmittance. The orthographic projection of the cover glass 213 in the direction perpendicular to the substrate 1 covers the second encapsulation layer, so as to further realize the protection of the device.

In the present embodiment, the silicon-based OLED display device includes the silicon-based OLED display substrate, and the display substrate is provided with the storage unit used for storing the compensation voltage of each MOSFET of the driving circuit, so that the voltage compensation of each MOSFET is realized. As a result, the uniformity of the driving characteristics of each MOSFET in the driving circuit is achieved, and the uniformity of the display brightness is also achieved, thereby improving the display effect of the silicon-based OLED display substrate. In addition, the miniaturization in the size of the OLED display module can be further ensured by properly adjusting the position layout of the storage unit in the driving circuit layer, and the OLED display module has a wide application prospect.

Based on the above display substrate, the present disclosure further provides a method for manufacturing the display substrate, including: forming a driving circuit layer on a silicon-based base, where the driving circuit layer includes a driving circuit, an electrical connection bonding area, and a storage unit for storing compensation voltage of each MOSFET of the driving circuit, an orthographic projection of the driving circuit on the silicon-based base, an orthographic projection of the storage unit on the silicon-based base, and an orthographic projection of the electrical connection bonding area on the silicon-based base do not overlap with each other; and forming a device layer on the driving circuit layer.

In the present embodiment, the display substrate is provided with the storage unit used for storing the compensation voltage of each MOSFET of the driving circuit, so that the voltage compensation of each MOSFET is realized. As a result, the uniformity of the driving characteristics of each MOSFET in the driving circuit is achieved, and the uniformity of the display brightness is also achieved, thereby improving the display effect of the silicon-based OLED display substrate. In addition, the miniaturization in the size of the OLED display module can be further ensured by properly adjusting the position layout of the storage unit in the driving circuit layer, and the OLED display module has a wide application prospect.

Figure 7:
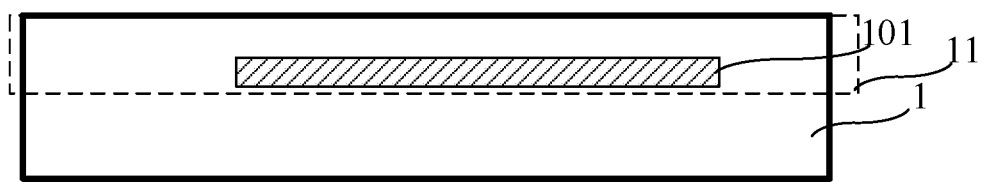
FIG. 7 is a schematic view illustrating steps of a manufacturing method of a display substrate according to an embodiment of the present disclosure.
Figure 8:
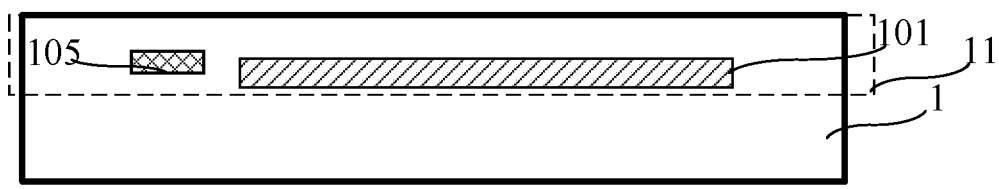
FIG. 8 is a schematic view illustrating steps of a manufacturing method of a display substrate according to an embodiment of the present disclosure.
Figure 9:
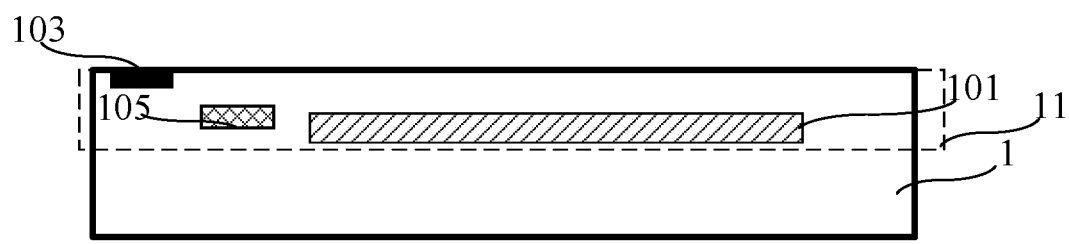
FIG. 9 is a schematic view illustrating steps of a manufacturing method of a display substrate according to an embodiment of the present disclosure.

Specifically, with reference to FIG. 7 to FIG. 9, the driver circuit layer 11 is formed on the silicon-based base 1 by:

forming the driver circuit 101 on the silicon-based base 1;
forming the storage unit 105 on the silicon-based base 1; and
forming the electrical connection binding area 103 that is electrically connected to output signal lines of the driving circuit 101 on the silicon-based base 1.

Figure 10:
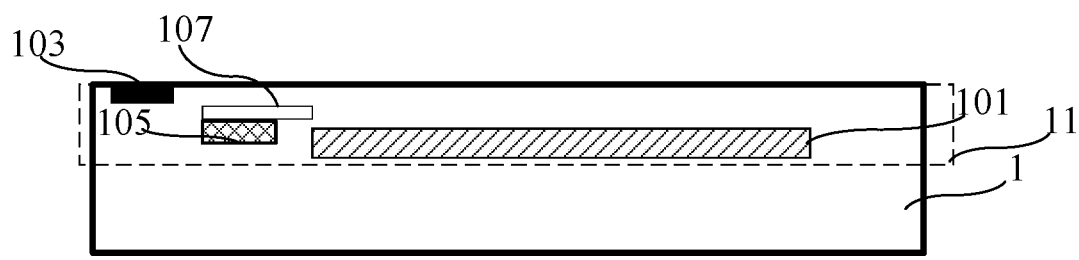
FIG. 10 is a schematic view illustrating steps of a manufacturing method of a display substrate according to an embodiment of the present disclosure.

In particular, referring to FIG. 10, after forming the storage unit 105 on the silicon-based base 1, the method further includes: forming a shielding layer 107 on the storage unit 105. As shown in FIG. 4, the orthographic projection of the shielding layer 107 on the silicon-based base 1 covers the orthographic projection of the storage unit 105 on the silicon-based base 1. FIG. 4 illustrates a situation where the orthographic projection of the shielding layer 107 on the silicon-based base 1 is larger than the orthographic projection of the storage unit 105 on the silicon-based base 1, but the present disclosure is not limited to this. The orthographic projection of the shielding layer 107 on the silicon-based base 1 may correspond to the orthographic projection of the storage unit 105 on the silicon-based base 1 as long as the shielding layer 107 is able to protect the storage unit 105. The shielding layer 107 may have a metal layer structure. The shielding layer 107 is formed on the storage unit 105 to protect the storage unit 105, thereby further protecting the trimming code stored in the storage unit 105, ensuring the uniformity of the driving characteristics of each MOSFET in the driving circuit and the uniformity of brightness to improve the display effect of the silicon-based OLED display substrate.

It should be noted that although the step of forming the device layer 2 on the driving circuit is not shown in FIGS. 7 to 10, it can be understood that after this step, the display substrate shown in FIG. 1 is formed on the driving circuit.

In view of the current existing problems, the present disclosure proposes a silicon-based OLED display substrate, a manufacturing method thereof, and a display device. By providing the storage unit used for storing the compensation voltage of each MOSFET of the driving circuit in the silicon-based OLED display substrate, the voltage compensation of each MOSFET in the drive circuit is realized. As a result, the uniformity of the driving characteristics of each MOSFET in the driving circuit is achieved, and the uniformity of the display brightness is also achieved, thereby improving the display effect of the silicon-based OLED display substrate. In addition, the miniaturization in the size of the OLED display module can be further ensured by properly adjusting the position layout of the storage unit in the driving circuit layer, and the OLED display module has a wide application prospect.

Apparently, the above embodiments are merely examples to clearly illustrate the present disclosure, and are not intended to limit the implementation of the present disclosure. Based on the above description, those ordinary skilled in the art may obtain different modifications and changes. Such modifications and changes cannot be all listed here. Any obvious changes or changes derived from the technical solutions of the present disclosure are still within the protection scope of the present disclosure.

What is claimed is:

1. A silicon-based OLED display substrate, comprising: a silicon-based base and a device layer arranged on the silicon-based base, wherein the silicon-based base comprises a drive circuit layer, and the drive circuit layer comprises a drive circuit, an electrical connection bonding area, and a storage unit for storing compensation voltage of each MOSFET of the drive circuit;
   wherein an orthographic projection of the drive circuit on the silicon-based base, an orthographic projection of the storage unit on the silicon-based base, and an orthographic projection of the electrical connection bonding area on the silicon-based base do not overlap with each other; and
   wherein an orthographic projection of the driving circuit layer on the silicon-based base is a rectangle including a long edge and a short edge, wherein
   the electrical connection bonding area is located on a side of the driving circuit layer corresponding to the short edge, and a distance between the storage unit and the long edge is greater than a preset cutting threshold; or
   the electrical connection bonding area is located on a side of the driving circuit layer corresponding to the long edge, and a distance between the storage unit and the short edge is greater than the preset cutting threshold.

2. The display substrate according to claim 1, wherein the storage unit is located on a side of the electrical connection bonding area close to the driving circuit.

3. The display substrate according to claim 1, wherein the preset cutting threshold is 450 microns.

4. The display substrate according to claim 1, wherein the device layer comprises an anode, an organic light-emitting layer, a cathode, a first encapsulation layer, and a color filter layer that are stacked in sequence in a direction facing away from the silicon-based base.

5. The display substrate according to claim 4, wherein the device layer further comprises a second encapsulation layer located on a side of the color filter layer facing away from the first encapsulation layer.

6. The display substrate according to claim 1, further comprising a shielding layer disposed on a side of the storage unit close to the device layer, and an orthographic projection of the shielding layer on the silicon-based base covers the orthographic projection of the storage unit on the silicon-based base.

7. The display substrate according to claim 1, wherein the storage unit is an OTP memory.

8. A silicon-based OLED display device comprising a silicon-based OELD display substrate, wherein the display substrate comprises a silicon-based base and a device layer arranged on the silicon-based base, wherein the silicon-based base comprises a drive circuit layer, and the drive circuit layer comprises a drive circuit, an electrical connection bonding area, and a storage unit for storing compensation voltage of each MOSFET of the drive circuit;
   wherein an orthographic projection of the drive circuit on the silicon-based base, an orthographic projection of the storage unit on the silicon-based base, and an orthographic projection of the electrical connection bonding area on the silicon-based base do not overlap with each other; and
   wherein an orthographic projection of the driving circuit layer on the silicon-based base is a rectangle including a long edge and a short edge, wherein
   the electrical connection bonding area is located on a side of the driving circuit layer corresponding to the short edge, and a distance between the storage unit and the long edge is greater than a preset cutting threshold; or
   the electrical connection bonding area is located on a side of the driving circuit layer corresponding to the long edge, and a distance between the storage unit and the short edge is greater than the preset cutting threshold.

9. The display device according to claim 8, wherein the storage unit is located on a side of the electrical connection bonding area close to the driving circuit.

10. The display device according to claim 8, wherein the preset cutting threshold is 450 microns.

11. The display device according to claim 8, wherein the device layer comprises an anode, an organic light-emitting layer, a cathode, a first encapsulation layer, and a color filter layer that are stacked in sequence in a direction facing away from the silicon-based base.

12. The display device according to claim 11, wherein the device layer further comprises a second encapsulation layer located on a side of the color filter layer facing away from the first encapsulation layer.

13. The display device according to claim 8, further comprising a shielding layer disposed on a side of the storage unit close to the device layer, and an orthographic projection of the shielding layer on the silicon-based base covers the orthographic projection of the storage unit on the silicon-based base.

14. The display substrate according to claim 8, wherein the storage unit is an OTP memory.

15. A method of manufacturing the display substrate, comprising:
   forming a driving circuit layer on a silicon-based base, wherein the driving circuit layer comprises a driving circuit, an electrical connection bonding area, and a storage unit for storing compensation voltage of each MOSEFT of the driving circuit, an orthographic projection of the driving circuit on the silicon-based base, an orthographic projection of the storage unit on the silicon-based base, and an orthographic projection of the electrical connection bonding area on the silicon-based base do not overlap with each other, and an orthographic projection of the driving circuit layer on the silicon-based base is a rectangle including a long edge and a short edge; and
   forming a device layer on the driving circuit layer;
   wherein forming a driving circuit layer on a silicon-based base comprises:
   forming the electrical connection bonding area on the silicon-based base, wherein the electrical connection bonding area is located on a side of the driving circuit layer corresponding to the short edge, and a distance between the storage unit and the long edge is greater than a preset cutting threshold; or the electrical connection bonding area is located on a side of the driving circuit layer corresponding to the long edge, and a distance between the storage unit and the short edge is greater than the preset cutting threshold.

16. The method according to claim 15, wherein the forming a driving circuit layer on a silicon-based base further comprises:
   forming the driving circuit on the silicon-based base; and
   forming the storage unit on the silicon-based base;
   wherein the electrical connection bonding area is electrically connected to output signal line of the driving circuit.

17. The method of claim 16, wherein after forming the storage unit on the silicon-based base, the method further comprises:
   forming a shielding layer on the storage unit, wherein an orthographic projection of the shielding layer on the silicon-based base covers the orthographic projection of the storage unit on the silicon-based base.

\* \* \* \* \*